(12) United States Patent
Kim et al.

(10) Patent No.: US 12,721,240 B2
(45) Date of Patent: Aug. 25, 2026

(54) SEMICONDUCTOR PACKAGE STRUCTURE HAVING INTERPOSER SUBSTRATE, AND STACKED SEMICONDUCTOR PACKAGE STRUCTURE INCLUDING THE SAME

(71) Applicant: SAMSUNG ELECTRONICS CO., LTD., Suwon-si (KR)

(72) Inventors: Sunchul Kim, Hwaseong-si (KR); Yonghyun Kim, Anyang-si (KR); Seunghwan Baek, Cheonan-si (KR); Minjae Lee, Seoul (KR); Juhyung Lee, Sejong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 899 days.

(21) Appl. No.: 17/876,240

(22) Filed: Jul. 28, 2022

(65) Prior Publication Data

US 2023/0126102 A1 Apr. 27, 2023

(30) Foreign Application Priority Data

Oct. 22, 2021 (KR) ........................ 10-2021-0141642

(51) Int. Cl.
*H10W 20/41* (2026.01)
*H10W 70/65* (2026.01)
(Continued)

(52) U.S. Cl.
CPC ......... *H10W 90/701* (2026.01); *H10W 70/65* (2026.01); *H10W 70/685* (2026.01);
(Continued)

(58) Field of Classification Search
CPC ......... H01L 23/49816; H01L 23/49822; H01L 23/49833; H01L 23/49838; H01L 25/105;
(Continued)

(56) References Cited

U.S. PATENT DOCUMENTS 6,483,195 B1 11/2002 Aoki et al.
6,617,696 B1 9/2003 Bendal
(Continued)

FOREIGN PATENT DOCUMENTS

CN 108899283 A 11/2018
JP 2016-162988 A 9/2016
(Continued)

OTHER PUBLICATIONS

Office Action in Korean Appln. No. 10-2021-0141642, mailed on Sep. 3, 2025, 19 pages (with English translation).
(Continued)

*Primary Examiner* — Samuel Park
(74) *Attorney, Agent, or Firm* — Fish & Richardson P.C.

(57) ABSTRACT

A semiconductor package structure includes a semiconductor chip on a package substrate; a lower connection bump on the package substrate; and an interposer substrate on the lower connection bump on the package substrate and an upper surface of the semiconductor chip. The semiconductor package structure includes an upper connection bump on a lower surface of the interposer substrate; and a support structure on a lower surface of the interposer substrate, spaced apart from the upper connection bump to provide support between the package substrate and the interposer substrate. The upper connection bump and the lower connection bump constitute a connection bump structure, and the support structure includes a metal core ball and a ball cover layer surrounding the metal core ball, wherein the ball cover layer is formed to gradually decrease in thickness in a direction from the interposer substrate to the package substrate cross-section.

16 Claims, 18 Drawing Sheets

(51) Int. Cl.

| | |
|---|---|
| ***H10W 70/685*** | (2026.01) |
| ***H10W 90/00*** | (2026.01) |
| *H10W 70/60* | (2026.01) |
| *H10W 74/00* | (2026.01) |
| *H10W 74/15* | (2026.01) |

(52) U.S. Cl.

CPC ......... *H10W 90/00* (2026.01); *H10W 90/401* (2026.01); *H10W 70/60* (2026.01); *H10W 74/00* (2026.01); *H10W 74/15* (2026.01); *H10W 90/722* (2026.01); *H10W 90/724* (2026.01); *H10W 90/734* (2026.01); *H10W 90/754* (2026.01)

(58) Field of Classification Search

CPC ......... H01L 24/16; H01L 24/32; H01L 24/48; H01L 24/73; H01L 2224/16146; H01L 2224/16225; H01L 2224/16227; H01L 2224/16237; H01L 2224/32225; H01L 2224/48225; H01L 2224/73204; H01L 2225/1023; H01L 2225/1041; H01L 2225/1058; H01L 2924/1431; H01L 2924/1434; H01L 2924/15331; H01L 2924/182; H01L 25/18; H01L 24/02; H01L 24/17; H01L 24/33; H01L 24/97; H01L 2224/0218; H01L 2224/02185; H01L 2224/0219; H01L 2224/0225; H01L 2224/02255; H01L 2224/0226; H10W 90/701; H10W 70/65; H10W 70/685; H10W 90/00; H10W 90/401; H10W 70/60; H10W 74/00; H10W 74/15; H10W 90/722; H10W 90/724; H10W 90/734; H10W 90/754; H10W 72/0198; H10W 72/20; H10W 72/30; H10W 72/981

See application file for complete search history.

(56) References Cited

U.S. PATENT DOCUMENTS

| | | | | |
|---|---|---|---|---|
| 7,754,535 | B2 | 7/2010 | Kobayashi | |
| 8,368,195 | B2 | 2/2013 | Tanie et al. | |
| 10,361,177 | B2 | 7/2019 | Kim et al. | |
| 10,535,608 | B1 * | 1/2020 | Rubin | H10W 70/65 |
| 11,450,614 | B2 | 9/2022 | Kim et al. | |
| 2010/0038772 | A1 | 2/2010 | Taguchi et al. | |
| 2014/0151863 | A1 | 6/2014 | Kim et al. | |
| 2014/0167263 | A1 * | 6/2014 | Wu | H01L 25/50 257/773 |
| 2015/0145130 | A1 * | 5/2015 | Lin | H01L 24/03 257/737 |
| 2016/0056087 | A1 * | 2/2016 | Wu | H01L 25/105 257/738 |
| 2017/0040184 | A1 * | 2/2017 | Hino | H10W 70/093 |
| 2019/0206839 | A1 * | 7/2019 | Balakrishnan | H01L 25/18 |
| 2020/0013764 | A1 * | 1/2020 | Kim | H01L 25/105 |
| 2020/0411444 | A1 | 12/2020 | Tsai et al. | |
| 2021/0151299 | A1 | 5/2021 | Kang | |
| 2021/0366834 | A1 | 11/2021 | Kim et al. | |
| 2022/0367399 | A1 * | 11/2022 | Lin | H10W 70/685 |
| 2023/0046413 | A1 * | 2/2023 | Chen | H10W 90/00 |

FOREIGN PATENT DOCUMENTS

| | | | |
|---|---|---|---|
| JP | 2021-082798 | A | 5/2021 |
| KR | 10-2014-0070057 | A | 6/2014 |
| KR | 10-2019-0025097 | A | 3/2019 |
| KR | 10-2021-0126228 | A | 10/2021 |

OTHER PUBLICATIONS

Notice of Allowance in Korean Appln. No. 10-2021-0141642, mailed on May 15, 2026, 9 pages (with English translation).

* cited by examiner

EN1-1
30a
T1-1
43a
40
38
30
30b
34a
36
44-1
45-1
43
T2-1
43b
T3
18a
18
10a
10
16
Z
Y
X 52
50
48
40
30
36
34a
38
34b
42
28b
44
43
45
43a
43b
30a
30b
IPA1
Z
Y
X 52
50
48
40
30
36
34a
38
34b
42
53
28b
44
43
45
43a
43b
30a
30b
IPA1
Z
X
Y 40
30
36
43b
43a
34a
38
42 34b
53
28b
45
43 44
30a
30b
IPA1
18
10
15
12
20a 20b
20
22
24
26
14
28a 16
10b
10a
CH1
Z
Y
X

SEMICONDUCTOR PACKAGE STRUCTURE HAVING INTERPOSER SUBSTRATE, AND STACKED SEMICONDUCTOR PACKAGE STRUCTURE INCLUDING THE SAME

CROSS-REFERENCE TO RELATED APPLICATION

This application is based on and claims priority under 35 U.S.C. § 119 to Korean Patent Application No. 10-2021-0141642, filed on Oct. 22, 2021, in the Korean Intellectual Property Office, the disclosure of which is incorporated by reference herein in its entirety.

BACKGROUND

The inventive concept relates to a semiconductor package structure and a stacked semiconductor package structure including the same, and more particularly, to a semiconductor package structure having an interposer substrate and a stacked semiconductor package structure including the same.

With the development of the electronics industry, the demand for high functionality and miniaturization of electronic components is rapidly increasing. In order to respond to this trend, a semiconductor package structure in which a plurality of semiconductor chips are stacked on one package substrate or an interposer substrate that is sandwiched between the semiconductor chips has been proposed. In addition, a stacked semiconductor package structure in which a second semiconductor package structure is stacked on a first semiconductor package structure has been proposed.

SUMMARY

The inventive concept provides a semiconductor package structure capable of improving junction reliability between upper connection bumps and lower connection bumps while maintaining a constant distance between an interposer substrate and a package substrate.

The inventive concept provides a stacked semiconductor package structure in which a second semiconductor package structure is stacked on a first semiconductor package structure.

According to an aspect of the inventive concept, there is provided a semiconductor package structure including a package substrate; a semiconductor chip positioned on the package substrate; a lower connection bump formed on the package substrate; an interposer substrate located on the lower connection bump on the package substrate and an upper surface of the semiconductor chip.

The semiconductor package structure includes an upper connection bump located on a lower surface of the interposer substrate and electrically connected to the lower connection bump on the package substrate; and a support structure located on a lower surface of the interposer substrate, spaced apart from the upper connection bump to provide support between the package substrate and the interposer substrate.

The upper connection bump and the lower connection bump constitute a connection bump structure, and the support structure includes a metal core ball and a ball cover layer surrounding the metal core ball, wherein the ball cover layer is formed to gradually decrease in thickness in a direction from the interposer substrate to the package substrate's cross-section.

According to an aspect of the inventive concept, there is provided a semiconductor package structure including a semiconductor chip mounting structure including a package substrate, a semiconductor chip mounted on the package substrate, and a lower connection bump formed on the package substrate around the semiconductor chip.

The semiconductor package structure includes an interposer substrate structure located on the semiconductor chip mounting structure. The interposer substrate structure includes an interposer substrate, an upper connection bump located on a lower surface of the interposer substrate and electrically connected to the lower connection bump on the package substrate, and a support structure located on a lower surface of the interposer substrate, spaced apart from the upper connection bump to provide support between the package substrate and the interposer substrate.

The upper connection bump and the lower connection bump constitute a connection bump structure, and the support structure includes a metal core ball and a ball cover layer surrounding the metal core ball, wherein the ball cover layer is formed to be gradually thinner in a cross-sectional direction from the interposer substrate to the package substrate.

The semiconductor package structure includes a molding layer providing sealing between an upper portion of the semiconductor chip mounting structure and a lower portion of the interposer substrate structure.

According to another aspect of the inventive concept, there is provided a stacked semiconductor package structure including a first semiconductor package structure; and a second semiconductor package structure stacked on the first semiconductor package structure.

The first semiconductor package structure includes a first package substrate; a first semiconductor chip located on a first package substrate; a lower connection bump formed on the first package substrate; an interposer substrate positioned on a lower connection bump on the first package substrate and an upper portion of the first semiconductor chip.

The first semiconductor package structure includes an upper connection bump located on a lower surface of the interposer substrate and electrically connected to the lower connection bump on the package substrate; and a support structure located on a lower surface of the interposer substrate, spaced apart from the upper connection bump to provide support between the package substrate and the interposer substrate.

The upper connection bump and the lower connection bump constitute a connection bump structure, and the support structure includes a metal core ball, and a ball cover layer surrounding the metal core ball, wherein the ball cover layer is formed in a cross-sectional view to gradually decrease in thickness in a direction from the interposer substrate to the package substrate.

The second semiconductor package structure includes a second package substrate; an external connection bump formed on a lower surface of the second package substrate and electrically connected to the interposer substrate; and a second semiconductor chip located on an upper surface of the second package substrate.

BRIEF DESCRIPTION OF THE DRAWINGS

Exemplary embodiments of the inventive concept will be more clearly understood from the following detailed description taken in conjunction with the accompanying drawings in which:

FIG. 1 is a cross-sectional view illustrating a semiconductor package structure according to an exemplary embodiment of the inventive concept;

FIGS. 2 and 3 are enlarged cross-sectional views illustrating some components of FIG. 1;

FIG. 4 is a bottom layout view of an interposer substrate of FIG. 1;

FIG. 5 is a cross-sectional view for explaining a support structure according to an exemplary embodiment of the inventive concept;

FIG. 14 is a cross-sectional view for explaining a stacked semiconductor package structure according to an exemplary embodiment of the inventive concept;

DETAILED DESCRIPTION OF THE PREFERRED EMBODIMENTS

Figure 6A:
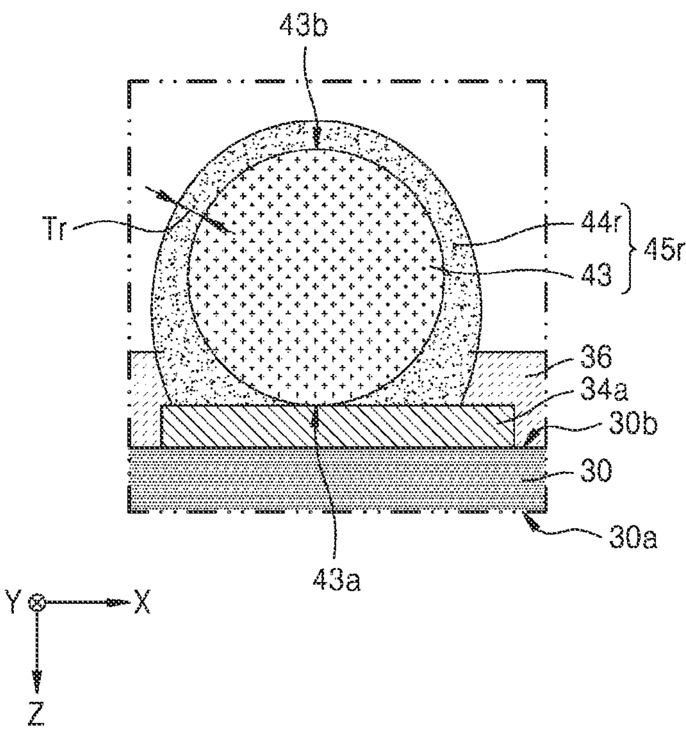
FIGS. 6A to 6C are cross-sectional views for explaining a method of manufacturing a support structure, according to an exemplary embodiment of the inventive concept.

Hereinafter, exemplary embodiments of the inventive concept are described in detail with reference to the accompanying drawings. The following exemplary embodiments of the inventive concept may be implemented as a single exemplary embodiment or may be implemented by combining one or more exemplary embodiments. Therefore, the inventive concept should not be construed as being limited to one exemplary embodiment.

In this specification, the singular form of the elements may include a plurality of forms, unless the context clearly indicates otherwise. In the present specification, drawing details are exaggerated in order to more clearly describe the inventive concept.

Figure 1:
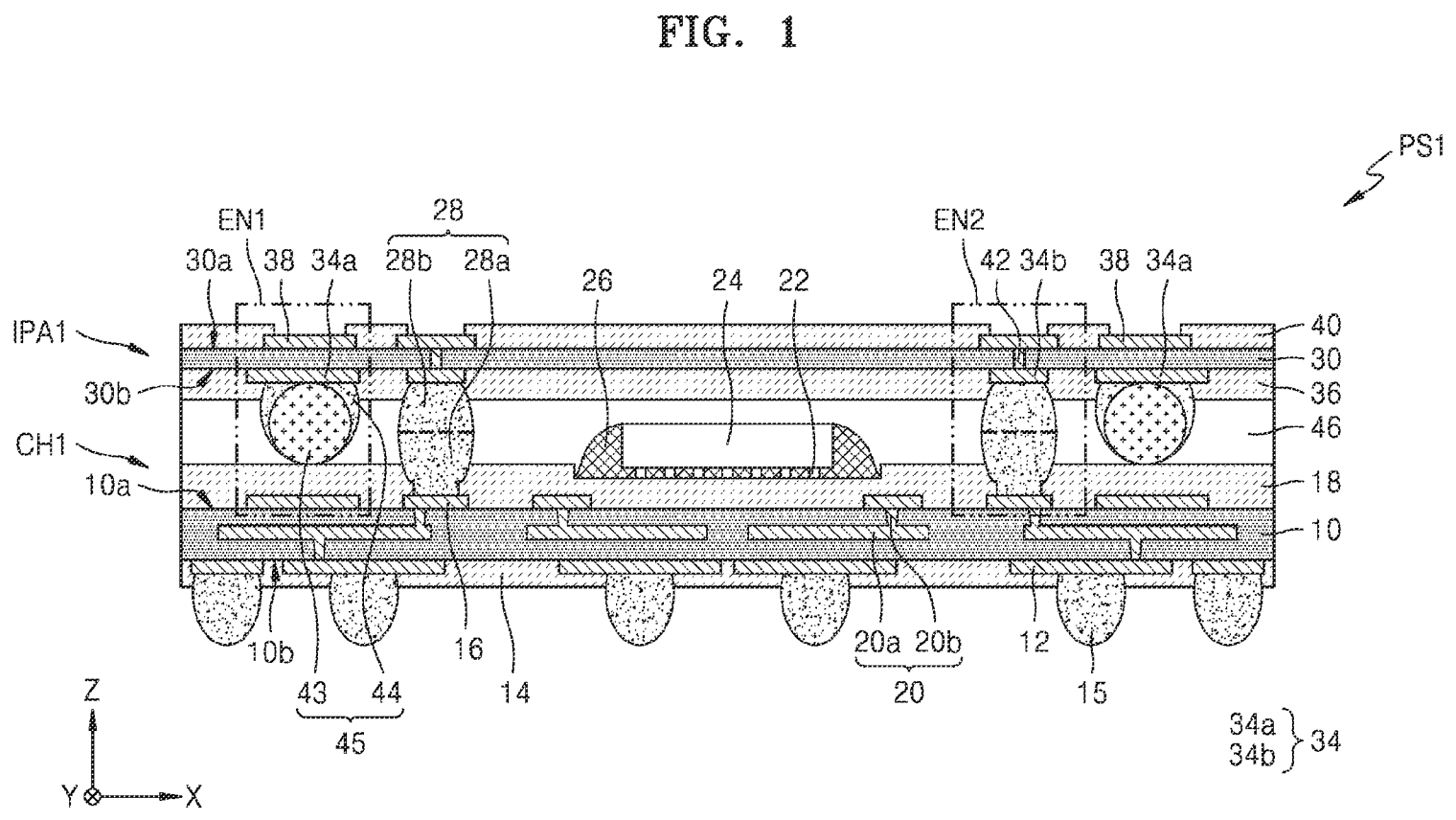
Figure 2:
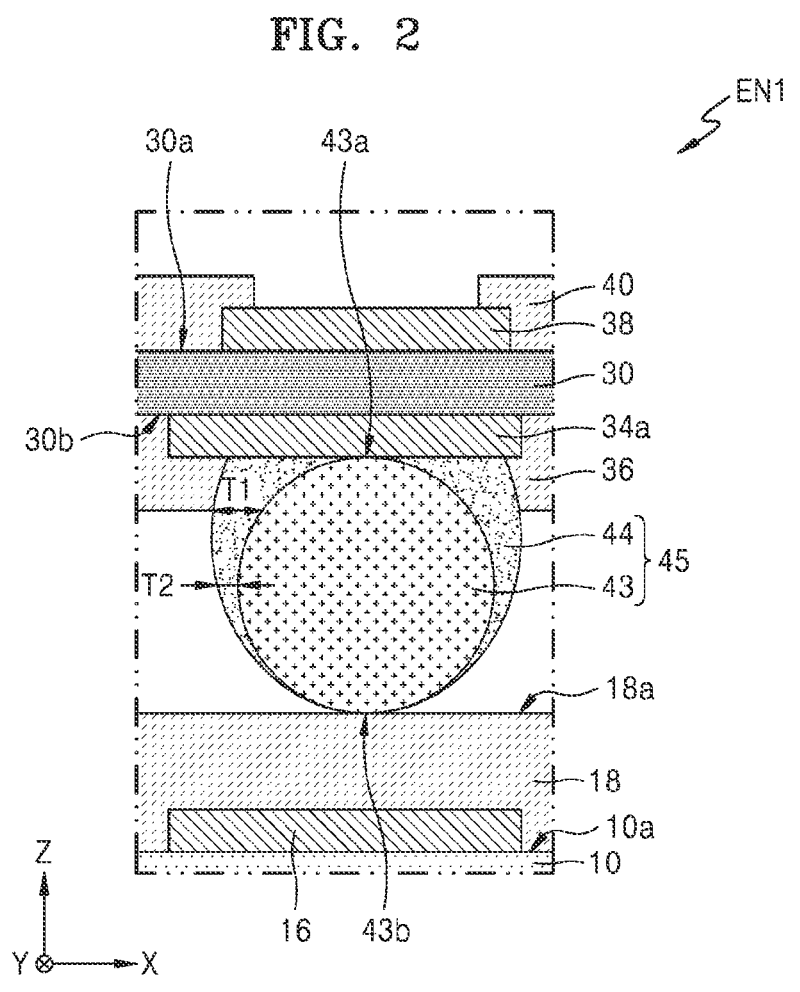
Figure 3:
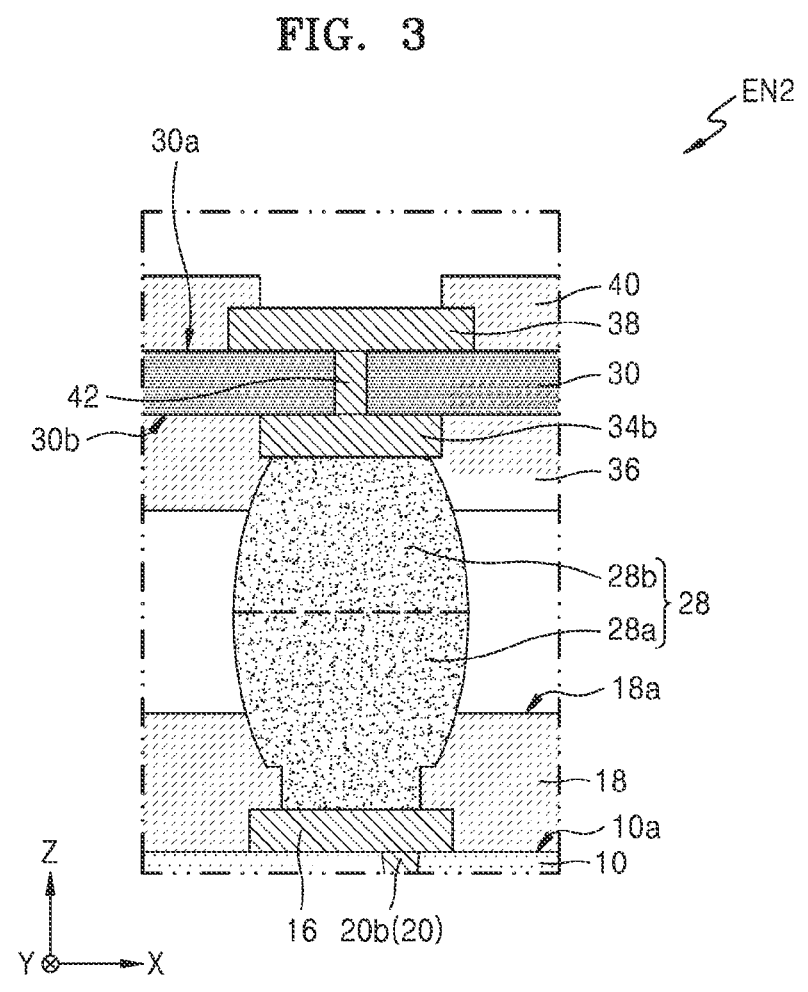
Figure 4:
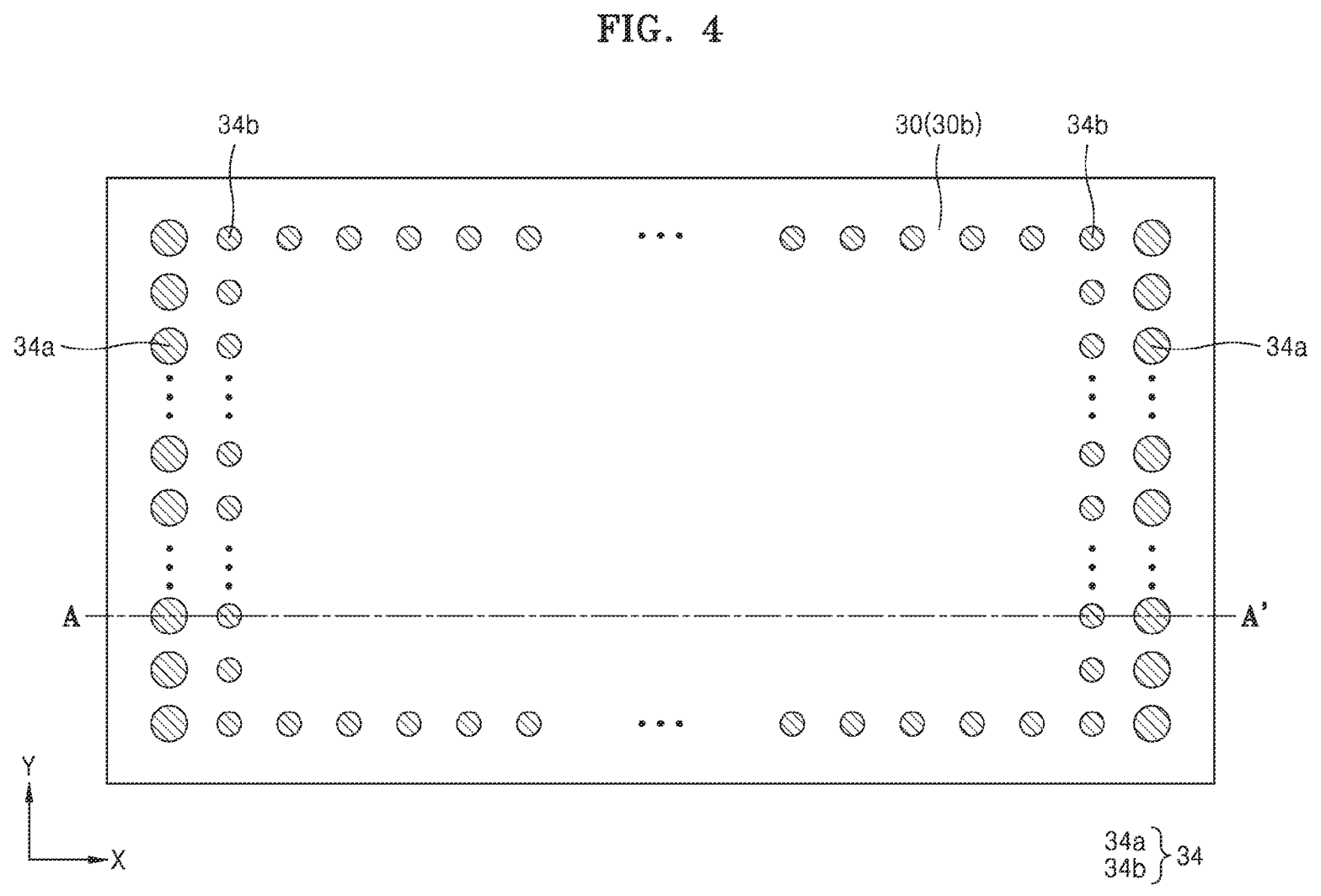

FIG. 1 is a cross-sectional view illustrating a semiconductor package structure according to an exemplary embodiment of the inventive concept, FIGS. 2 and 3 are enlarged cross-sectional views illustrating some components of FIG. 1, and FIG. 4 is a bottom layout view of an interposer substrate of FIG. 1.

In detail, FIG. 1 is a cross-sectional view illustrating an overall configuration of a semiconductor package structure PS1. FIG. 2 is an enlarged view of an EN1 portion of FIG. 1 and is provided to describe a support structure 45. FIG. 3 is an enlarged view of an EN2 portion of FIG. 1 and is provided to describe a connection bump structure 28.

FIG. 4 is a layout view for describing the arrangement of a first lower interposer connection pad 34*a* and a second lower interposer connection pad 34*b* of the interposer substrate 30 of FIG. 1. In the semiconductor package structure PS1 of FIG. 1, the interposer substrate 30, the first lower interposer connection pad 34*a*, and the second lower interposer connection pad 34*b* may be cross-sectional views taken along line A-A' in FIG. 4.

As shown in FIG. 1, the semiconductor package structure PS1 may include a semiconductor chip mounting structure CH1, an interposer substrate structure IPA1 positioned on the semiconductor chip mounting structure CH1, and a molding layer 46 for sealing the space between the semiconductor chip mounting structure CH1 and the interposer substrate structure IPA1.

The semiconductor chip mounting structure CH1 may include a package substrate 10. The package substrate 10 may be a printed circuit board (PCB). The PCB may be a rigid PCB or a flexible PCB.

The package substrate 10 may include a phenol resin, an epoxy resin, a polyimide, or a combination thereof. For example, the package substrate 10 may include flame retardant 4 (FR4), tetrafunctional epoxy, polyphenylene ether, epoxy/polyphenylene oxide, bismaleimide triazine (BT), thermount, cyanate esters, polyimide or a liquid crystal polymer.

The package substrate 10 may include an upper surface 10*a* and a lower surface 10*b*. The package substrate 10 may include a package wiring layer 20. The package wiring layer 20 may include a package base wiring layer 20*a* and a package via wiring layer 20*b* electrically connecting the package base wiring layers 20*a*. The package wiring layer 20 may include copper (Cu), nickel (Ni), aluminum (Al), silver (Ag), gold (Au), or a combination thereof.

A package upper connection pad 16 and a package lower connection pad 12 may be respectively arranged on the upper surface 10*a* and the lower surface 10*b* of the package substrate 10. The package upper connection pad 16 and the package lower connection pad 12 may include copper (Cu), nickel (Ni), aluminum (Al), silver (Ag), gold (Au), or any combination thereof.

A package upper protective layer 18 that insulates the package upper connection pads 16 may be positioned on the upper surface 10*a* of the package substrate 10. A lower package protective layer 14 that insulates the package lower connection pads 12 may be positioned on the lower surface 10*b* of the package substrate 10. The package upper protective layer 18 and the package lower protection layer 14 may be a solder resist layer.

In some exemplary embodiments, the package substrate 10 may be referred to as a package substrate base layer. When the package substrate 10 is referred to as a package substrate base layer, the package substrate base layer, the package upper connection pad 16, the package lower connection pad 12, the package upper protective layer 18, the package lower protective layer 14, and the package wiring layer 20 may be collectively referred to as a package substrate.

The semiconductor chip mounting structure CH1 may include an external connection bump 15. The external connection bump 15 may be attached to the package lower connection pad 12. The external connection bump 15 may be electrically connected to a motherboard or an external device. The external connection bump 15 may be a solder ball.

The semiconductor chip mounting structure CH1 may include a semiconductor chip 24, a chip connection bump 22, an underfill layer 26, and a lower connection bump 28*a*. The semiconductor chip 24 may be mounted on the package substrate 10. The semiconductor chip 24 may be electrically connected to the package substrate 10 through the chip connection bump 22. The semiconductor chip 24 may be electrically connected to the package wiring layer 20 through the chip connection bump 22. The chip connection bump 22 may be a solder ball. The chip connection bump 22 may be formed of gold (Au), silver (Ag), copper (Cu), nickel (Ni), tin (Sn), lead (Pb), or any combination thereof.

The semiconductor chip 24 may be a logic chip or a memory chip. In some exemplary embodiments, the logic chip may be a memory controller chip, a central processing unit (CPU) chip, a graphics processing unit (GPU) chip, or an application processor (AP) chip.

In some exemplary embodiments, the memory chip may be a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The semiconductor chip 24 may be arranged at the central portion of the package substrate 10. As shown in FIG. 1, the underfill layer 26 may be formed between both side surfaces of the semiconductor chip 24, an upper portion of the package upper protective layer 18, and the chip connection bump 22. The underfill layer 26 reliably attaches the semiconductor chip 24 to the package substrate 10 and may be omitted as unnecessary.

The semiconductor chip mounting structure CH1 may include the lower connection bump 28*a*. The lower connection bump 28*a* may be formed on the package substrate 10 on the perimeter of the semiconductor chip 24. The lower connection bump 28*a* may be connected to an upper connection bump 28*b* of the interposer substrate structure IPA1 to form the connection bump structure 28. The lower connection bump 28*a* and the upper connection bump 28*b* may each be a solder layer. The lower connection bump 28*a* and the upper connection bump 28*b* may each be a solder ball.

In some exemplary embodiments, the lower connection bump 28*a* and the upper connection bump 28*b* may each be formed of gold (Au), silver (Ag), copper (Cu), nickel (Ni), tin (Sn), lead (Pb), or any combination thereof. In some exemplary embodiments, the lower connection bump 28*a* and the upper connection bump 28*b* may each be formed of tin, a tin-copper alloy, or a tin-silver alloy.

The interposer substrate structure IPA1 may include the interposer substrate 30, the upper connection bump 28*b*, and the support structure 45. The interposer substrate 30 may include an organic material, glass, ceramic, or a semiconductor. In some exemplary embodiments, the interposer substrate 30 may include silicon (Si). The interposer substrate 30 may be a substrate on which an active element, for example, a transistor is formed.

The interposer substrate 30 includes an upper surface 30*a* and a lower surface 30*b* as shown in FIG. 1. An interposer wiring layer 42 may be included in the interposer substrate 30. The interposer wiring layer 42 may include copper (Cu), nickel (Ni), aluminum (AL), silver (AG), gold (Au), or any combination thereof.

An upper interposer connection pad 38 and lower interposer connection pads 34 may be arranged on the upper surface 30*a* and the lower surface 30*b* of the interposer substrate 30, respectively. The upper interposer connection pads 38 and the lower interposer connection pads 34 may be arranged to correspond to the circumference of the semiconductor chip 24.

The lower interposer connection pad 34 may include a first lower interposer connection pad 34*a* electrically connected to the connection bump structure 28 and a second lower interposer connection pad 34*b* electrically connected to the support structure 45.

The lower interposer connection pads 34 may be arranged around the lower surface 30*b* of the interposer substrate 30 as shown in FIG. 4. In FIG. 4, the lower interposer connection pads 34 are illustrated as being arranged around the edge of the lower surface 30*b* of the interposer substrate 30, however, if necessary, the lower interposer connection pads 34 may be formed in another portion, for example, a region that does not overlap the semiconductor chip 24, such as a region near the center of the lower surface 30*b* of the interposer substrate 30.

In addition, the size of the second lower interposer connection pad 34*b* may be less than the size of the first lower interposer connection pad 34*a* in a plan view. The upper interposer connection pad 38 and the lower interposer connection pad 34 may include copper (Cu), nickel (Ni), aluminum (AL), silver (AG), gold (Au), or any combinations thereof.

An interposer upper protective layer 40 that insulates the upper interposer connection pads 38 may be positioned on the upper surface 30*a* of the interposer substrate 30. An interposer lower protective layer 36 that insulates the lower interposer connection pads 34 may be positioned on the lower surface 30*b* of the interposer substrate 30. The interposer upper protective layer 40 and the interposer lower protection layer 36 may be a solder resist layer.

In some exemplary embodiments, the interposer substrate 30 may be referred to as an interposer substrate base layer. When the interposer substrate 30 is referred to as an interposer base layer, the interposer base layer, the upper interposer connection pad 38, the lower interposer connection pad 34, the interposer upper protective layer 40, the interposer lower protective layer 36, and the interposer wiring layer 42 may be collectively referred to as an interposer substrate.

The upper connection bump 28*b* may be formed on the second lower interposer connection pad 34*b* in accordance to the perimeter of the semiconductor chip 24. The upper connection bump 28*b* may be electrically connected to the lower connection bump 28*a*. The material of the upper connection bump 28*b* is the same as that described above. The upper connection bump 28*b* may be combined with the lower connection bump 28*a* to form the connection bump structure 28. In a plan view, the connection bump structure 28 may be arranged on the outer periphery of the semiconductor chip 24.

The connection bump structure 28 is described in more detail with reference to FIG. 3. The connection bump structure 28 may be a structure in which the lower connection bump 28*a* is bonded to the upper connection bump 28*b*. The lower connection bump 28*a* may be insulated by the package upper protective layer 18. The upper connection bump 28*b* may be insulated by the interposer lower protective layer 36.

The connection bump structure 28 may be a real structure electrically connected to the package wiring layer 20 in the package substrate 10, that is, the package via wiring layer 20*b* and the package upper connection pad 16. The connection bump structure 28 may be a real structure electrically connected to the second lower interposer connection pad 34*b* and the interposer wiring layer 42 in the interposer substrate 30.

The connection bump structure 28 may electrically connect the second lower interposer connection pad 34*b* to the package upper connection pad 16. Accordingly, the connection bump structure 28 may be a real structure electrically connected to the package wiring layer 20 and the interposer wiring layer 42.

The support structure 45 is positioned apart from the upper connection bump 28*b* in the lower surface 30*b* of the interposer substrate 30 and provides support between the package substrate 10 and the interposer substrate 30. In a plan view, the support structure 45 may be arranged on the outer periphery of the connection bump structure 28. The support structure 45 may include a metal core ball 43 and a ball cover layer 44 surrounding the metal core ball 43. The support structure 45 is described in more detail with reference to FIG. 2.

The support structure 45 may be a dummy structure that is not electrically connected to the package wiring layer 20 in the package substrate 10. The metal core ball 43 included in the support structure 45 may be a conductive ball. In some exemplary embodiments, the metal core ball 43 may be a copper ball. The metal core ball 43 may be circular or elliptical in cross-section. The diameter of the metal core ball 43 may be several hundreds of micrometers (m). The upper surface 43*a* of the metal core ball 43 may be in contact with the first lower interposer connection pad 34*a* of the interposer substrate 30.

In some exemplary embodiments, the ball cover layer 44 included in the support structure 45 may be of the same material as the material of the solder layer. In some exemplary embodiments, the ball cover layer 44 may be made of tin, a tin-copper alloy, or a tin-silver alloy.

The ball cover layer 44 may be formed to be gradually thinner in a cross-sectional view in a direction from the interposer substrate 30 to the package substrate 10. The ball cover layer 44 is sequentially formed on the surface of the metal core ball 43 to have a first thickness T1 and a second thickness T2 in a direction from the first lower interposer connection pad 34*a* of the interposer substrate 30 to the package upper protective layer 18. The first thickness T1 and the second thickness T2 may be several tens of micrometers (m).

The upper surface of the ball cover layer 44 may be in contact with the first lower interposer connection pad 34*a* of the interposer substrate 30. The ball cover layer 44 may be formed to surround a portion of the metal core ball 43 to expose a lower surface 43*b* of the metal core ball 43. The lower surface 43*b* of the metal core ball 43 may be in contact with an upper surface 18*a* of the package upper protective layer 18.

The semiconductor package structure PS1 may include the molding layer 46 that forms a seal between the semiconductor chip mounting structure CH1 and the interposer substrate structure IPA1 as shown in FIG. 1. The molding layer 46 may seal the entirety of the semiconductor chip 24 positioned between the upper surface 10*a* of the package substrate 10 and the lower surface of the interposer substrate 30, the connection bump structure 28, and the support structure 45.

The molding layer 46 may include a thermosetting resin, a thermoplastic resin, a UV curable resin, or a combination thereof. The molding layer 46 may include an epoxy resin, a silicone resin, or a combination thereof. The molding layer 46 may include an epoxy mold compound (EMC).

The semiconductor package structure PS1 of the inventive concept may maintain a constant distance between the interposer substrate 30 and the package substrate 10 due to the support structure 45. In addition, in the semiconductor package structure PS1 of the inventive concept, as will be described later, a flux may be uniformly formed on the surface of the upper connection bump 28*b* to improve junction reliability between the lower connection bump 28*a* and the upper connection bump 28*b*.

Figure 5:
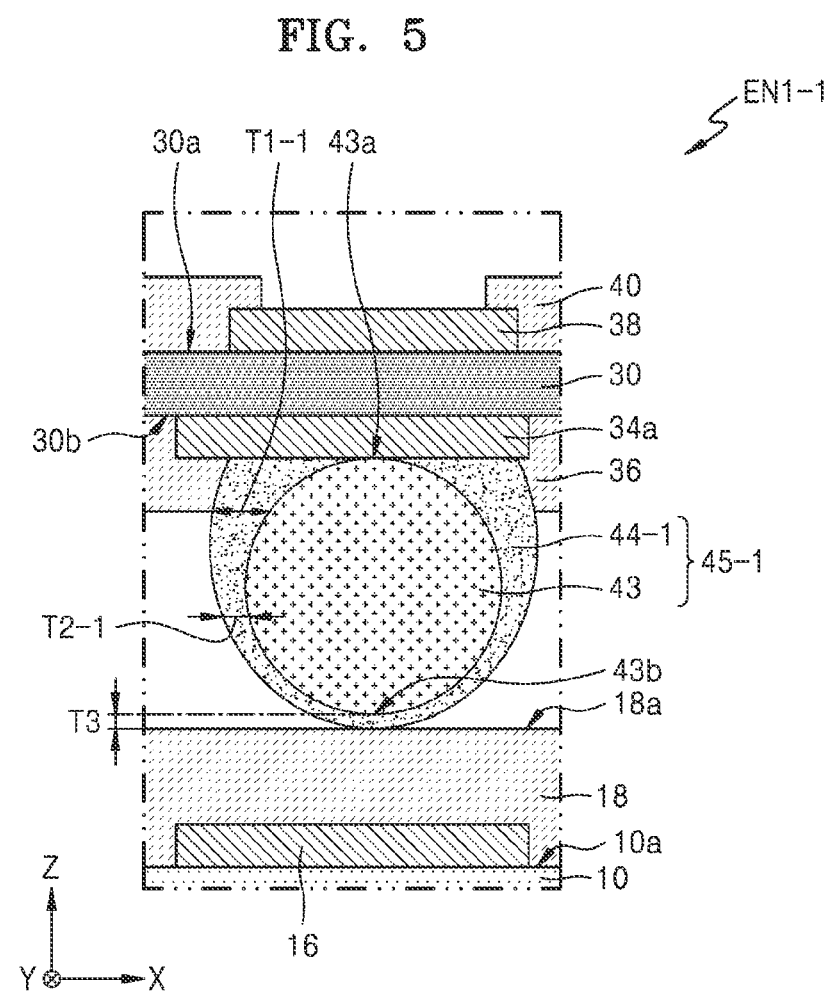

FIG. 5 is a cross-sectional view for explaining a support structure according to an exemplary embodiment of the inventive concept.

In detail, FIG. 5 may be a view for explaining a support structure 45-1 as a modified example of the EN1 portion of FIG. 2. FIG. 5 may be a portion EN1-1 corresponding to portion EN1 of FIG. 2. FIG. 5 may be the same as that of FIG. 2 except for the support structure 45-1. In FIG. 5, the same or similar reference numerals as those of FIGS. 1 to 4 indicate the same or similar members. In FIG. 5, the same descriptions as those given in FIGS. 1 to 4 are either briefly given or omitted as redundant.

The support structure 45-1 may be positioned on the lower surface 30*b* of the interposer substrate 30 to provide support between the package substrate 10 and the interposer substrate 30. The support structure 45-1 may include a metal core ball 43 and a ball cover layer 44-1 surrounding the metal core ball 43.

The ball cover layer 44-1 may be formed to be gradually thinner in a cross-sectional view in a direction from the interposer substrate 30 to the package substrate 10. The ball cover layer 44-1 may be formed to entirely surround the metal core ball 43 so as not to expose the lower surface 43*b* of the metal core ball 43.

The ball cover layer 44-1 is sequentially formed on the surface of the metal core ball 43 to have a first thickness T1-1 and a second thickness T2-1 that is less than the first thickness T1-1 in a direction from the first lower interposer connection pad 34*a* of the interposer substrate 30 to the package upper protective layer 18. The first thickness T1-1 and the second thickness T2-1 may be several tens of micrometers (m).

The ball cover layer 44-1 is formed on the upper surface 18*a* of the package upper protective layer 18 by a third thickness T3. A lower surface of the ball cover layer 44-1 may contact the package upper protective layer 18. In some exemplary embodiments, the third thickness T3 may be several micrometers (m). In some exemplary embodiments, the third thickness T3 may be one micrometer (m) or less. The upper surface of the ball cover layer 44 may be in contact with the first lower interposer connection pad 34*a* of the interposer substrate 30.

The upper surface 43*a* of the metal core ball 43 may be in contact with the first lower interposer connection pad 34*a* of the interposer substrate 30. The lower surface 43*b* of the metal core ball 43 may contact the package upper protective layer 18 with the ball cover layer 44-1 therebetween. The support structure 45-1 as described above may maintain a constant distance between the interposer substrate 30 and the package substrate 10.

Figure 6B:
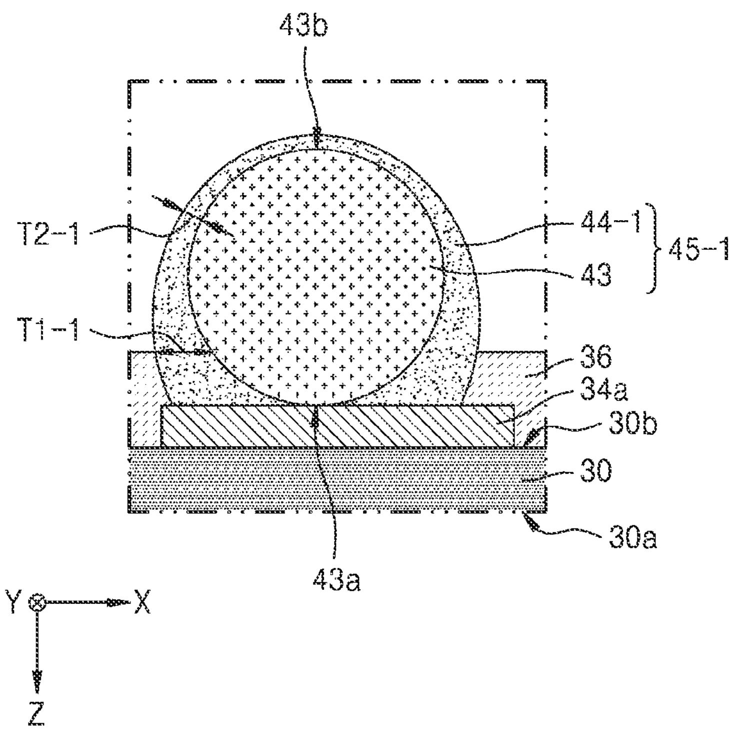
Figure 6C:
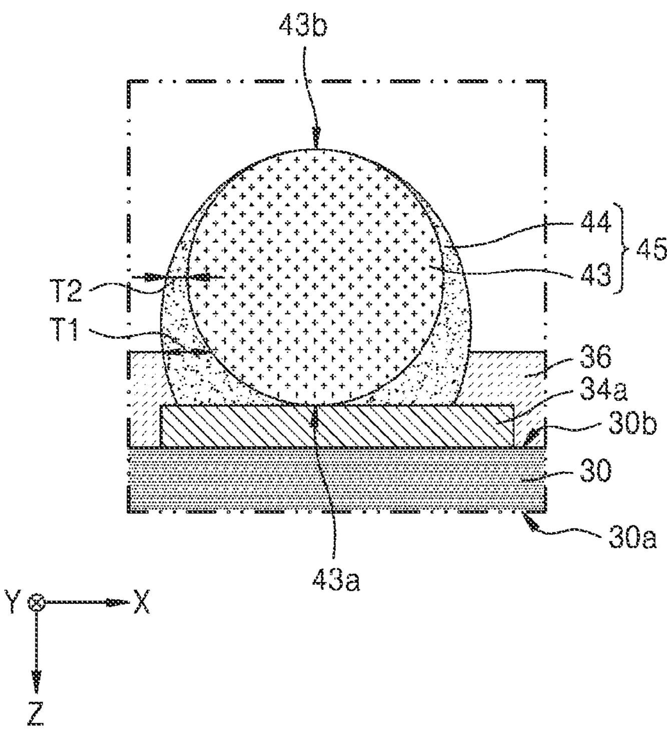

FIGS. 6A to 6C are cross-sectional views for explaining a method of manufacturing a support structure, according to an exemplary embodiment of the inventive concept.

In detail, in FIGS. 6A to 6C, the same or similar reference numerals as in FIGS. 2 and 5 indicate the same or similar members. In FIGS. 6A to 6C, the same descriptions as those given in FIGS. 2 and 5 are either briefly given or omitted as redundant.

Referring to FIG. 6A, an interposer substrate 30 having an upper surface 30*a* and a lower surface 30*b* is prepared. A first lower interposer connection pad 34*a* is formed on the lower surface 30*b* of the interposer substrate 30. An interposer lower protective layer 36 exposing a partial surface of a first lower interposer connection pad 34*a* is formed on the interposer substrate 30 and the first lower interposer connection pad 34*a*.

Subsequently, a metal core ball 43 and a preliminary ball cover layer 44*r* surrounding the metal core ball 43 are formed on the first lower interposer connection pad 34*a*. The metal core ball 43 may include an upper surface 43*a* and a lower surface 43*b*. The metal core ball 43 may be formed using a ball mounter. In some exemplary embodiments, the metal core ball 43 may be made of copper.

In some exemplary embodiments, the preliminary ball cover layer 44*r* may be formed using a metal plating process. In some exemplary embodiments, the preliminary ball cover layer 44*r* may be formed using a deposition process. In some exemplary embodiments, the preliminary ball cover layer 44*r* may be formed of tin, a tin-copper alloy, or a tin-silver alloy. The metal core ball 43 and the preliminary ball cover layer 44*r* are included in the preliminary support structure 45*r*.

Referring to FIG. 6B, the preliminary ball cover layer (44*r* of FIG. 6A) surrounding the metal core ball 43 is partially etched to form a first ball cover layer 44-1. In this case, as described with reference to FIG. 5, the first ball cover layer 44-1 may be formed to have a thickness gradually decreasing in a cross-sectional view in a direction from the interposer substrate 30 to the package substrate (10 in FIG. 1). The first ball cover layer 44-1 may be formed to surround the metal core ball 43 without exposing the lower surface 43*b* of the metal core ball 43.

The first ball cover layer 44-1 may be sequentially formed on the surface of the metal core ball 43 to have a first thickness T1-1 and a second thickness T2-1 that is less than the first thickness T1-1 in a direction from the first lower interposer connection pad 34*a* of the interposer substrate 30 to the package upper protective layer (18 in FIG. 2). Through this, the metal core ball 43 and the first ball cover layer 44-1 may be included in the support structure 45-1.

Referring to FIG. 6C, the first ball cover layer (44-1 in FIG. 6B) surrounding the metal core ball 43 is further etched to form a second ball cover layer 44. In this case, as described with reference to FIG. 2, the second ball cover layer 44 may be formed to have a thickness gradually decreasing in a cross-sectional view in a direction from the interposer substrate 30 to the package substrate (10 in FIG. 1). The second ball cover layer 44 may be formed to surround the metal core ball 43 while exposing the lower surface 43*b* of the metal core ball 43.

The second ball cover layer 44 may be sequentially formed on the surface of the metal core ball 43 to have a first thickness T1 and a second thickness T2 that is less than the first thickness T1 in a direction from the first lower interposer connection pad 34*a* of the interposer substrate 30 to the package upper protective layer (18 in FIG. 2). Through this, the metal core ball 43 and the second ball cover layer 44 may be included in the support structure 45.

In connection with FIGS. 6A to 6C above, it has been described that the second ball cover layer 44 is formed by etching the preliminary ball cover layer 44*r* and the first ball cover layer 44-1, but in some exemplary embodiments, the first ball cover layer 44-1 or the second ball cover layer 44 may be formed by adjusting the deposition thickness of the preliminary ball cover layer 44*r* formed on the surface of the metal core ball 43.

FIGS. 7 to 10 are cross-sectional views illustrating a method of manufacturing a semiconductor package structure, according to an exemplary embodiment of the inventive concept.

In detail, FIGS. 7 to 10 are provided to describe the method of manufacturing the semiconductor package structure of FIGS. 1 to 4. In FIGS. 7 to 10, the same or similar reference numerals as those of FIGS. 1 to 4 indicate the same or similar members. In FIGS. 7 to 10, the same descriptions as those given in FIGS. 1 to 4 are either briefly given or omitted as redundant.

Figure 7:
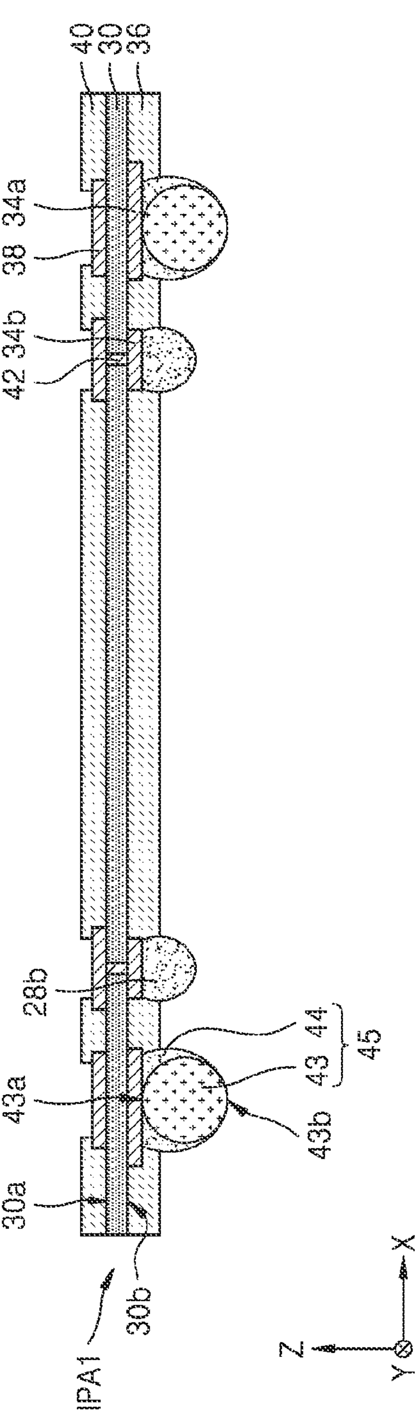
FIGS. 7 to 10 are cross-sectional views illustrating a method of manufacturing a semiconductor package structure, according to an exemplary embodiment of the inventive concept.

Referring to FIG. 7, an interposer substrate structure IPA1 is prepared. The interposer substrate structure IPA1 may include an interposer substrate 30, an upper connection bump 28*b*, and a support structure 45. The upper connection bump 28*b* may be located on a lower surface 30*b* of the interposer substrate 30. The upper connection bump 28*b* may be connected to a second lower interposer connection pad 34*b*.

The support structure 45 may be located on the lower surface 30*b* of the interposer substrate 30. The support structure 45 may be connected to the first lower interposer connection pad 34*a*. The upper connection bumps 28*b* and the support structures 45 may be arranged around the interposer substrate 30. The support structures 45 may be arranged around the outer side of the upper connection pump 28*b*. The support structure 45 may include a metal core ball 43 with an exposed lower surface thereof and a ball cover layer 44 surrounding only a portion of the metal core ball 43.

Figure 8:
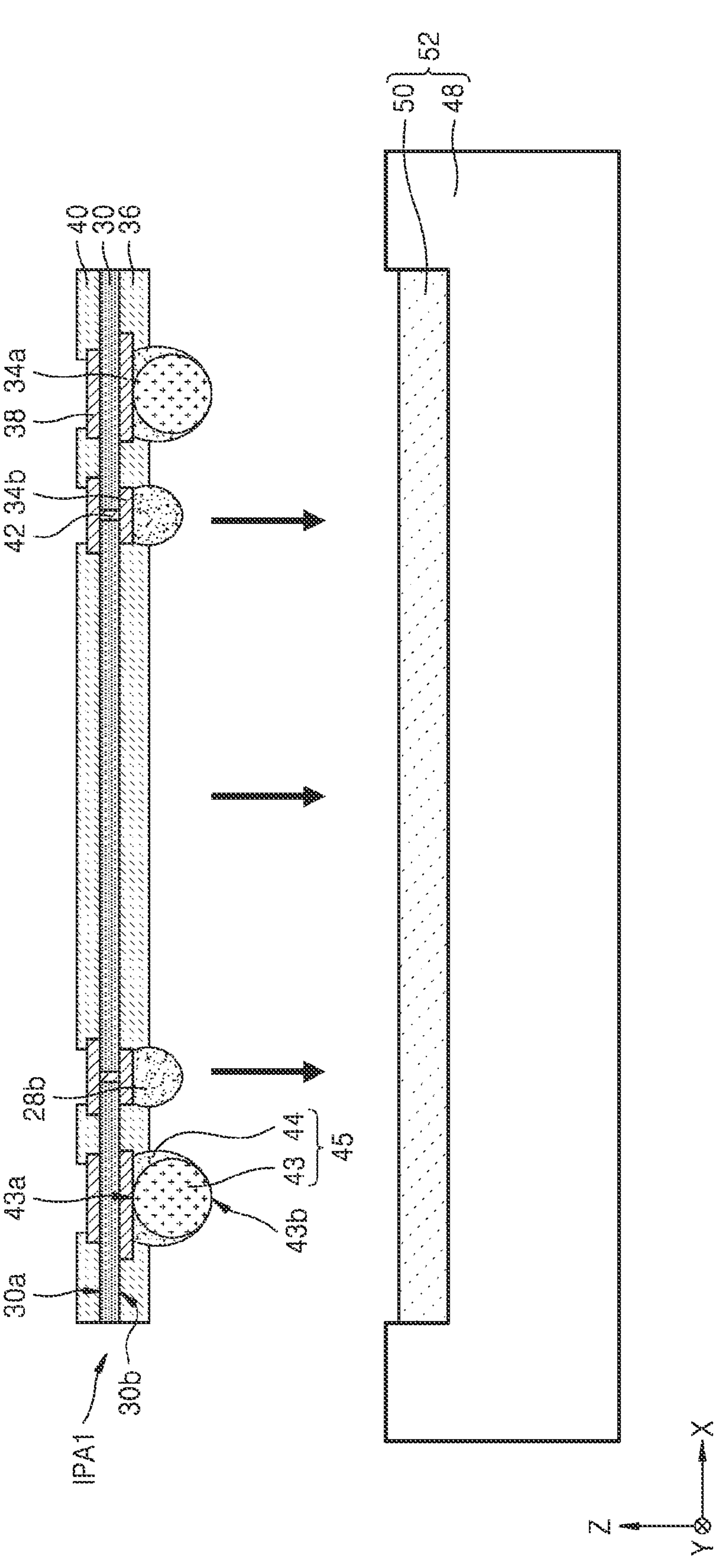

Referring to FIG. 8, the interposer substrate structure IPA1 is positioned on a flux dipping apparatus 52. The flux dipping apparatus 52 may include a body 48 and a flux 50 contained within the body 48. Here, the flux 50 is briefly described.

The flux 50 may be a catalyst that helps the upper connection bump 28*b* to be bonded to the lower connection bump (28*a* of FIG. 1) by soldering. The flux 50 may prevent natural oxidation of the upper connection bumps 28*b* and prevent contact with air during soldering.

The flux 50 may increase wettability of the upper connection bumps 28*b* during soldering, thereby improving bonding quality between the upper connection bumps 28*b* and the lower connection bumps (28*a* of FIG. 1) of the package substrate (10 of FIG. 1). The flux 50 may include natural rosin or resin, a solvent, and an activator, and may be in a liquid form or a gel form. As shown in FIG. 8, by lowering the interposer substrate structure IPA1 in a direction of the flux dipping apparatus 52, the upper connection bump 28*b* may be dipped into the flux 50.

Figure 9:
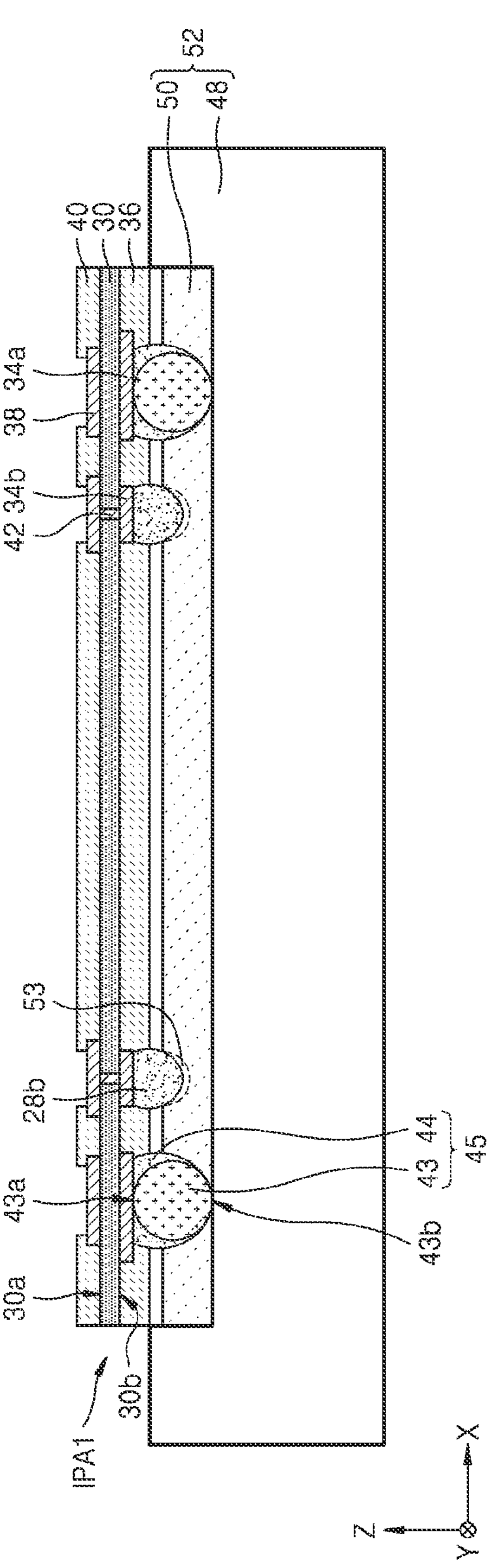

Referring to FIG. 9, FIG. 9 is a view of the interposer substrate structure IPA1 fully lowered into the flux 50 of the flux dipping apparatus 52. The lower surface 43*b* of the metal core ball 43 included in the support structure 45 may be supported on the surface of the body 48 of the flux dipping apparatus 52. The metal core ball 43 constituting the support structure 45 performs the role of blocking the continuous fall of the interposer substrate structure IPA1.

In this case, the flux 50 may be uniformly coated on the surface of the upper connection bump 28*b* formed under the interposer substrate 30. As shown in FIG. 9, a flux coating layer 53 may be formed uniformly on the surface of the upper connection bump 28*b*.

Figure 10:
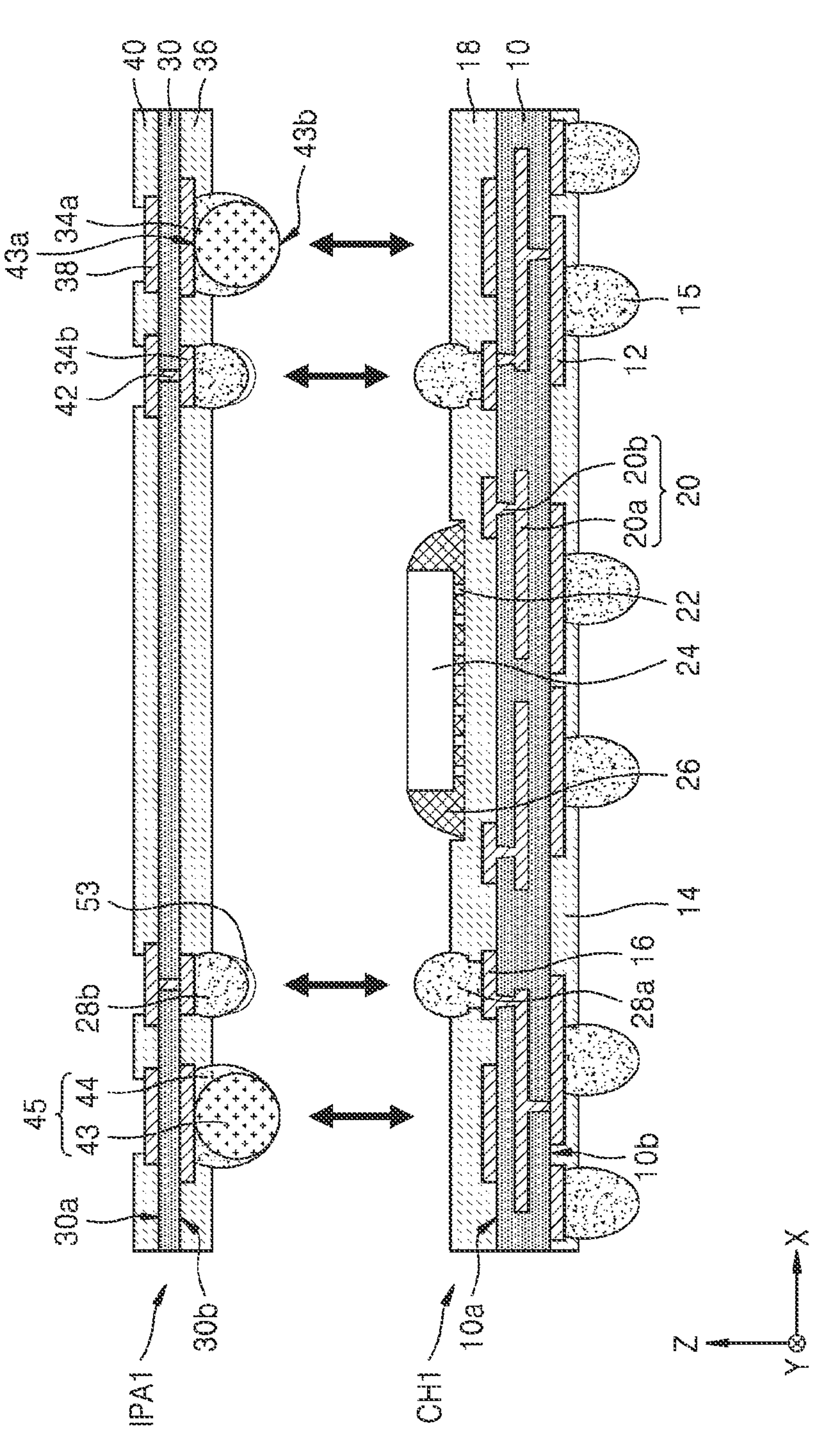

Referring to FIG. 10, the interposer substrate structure IPA1 having the support structure 45 and the flux coating layer 53 on the surface of the upper connection bump 28*b* is positioned on the semiconductor chip mounting structure CH1. As described with reference to FIG. 1, the semiconductor chip mounting structure CH1 may include a package substrate 10, a semiconductor chip 24, a package upper protective layer 18, a lower package protective layer 14, and a lower connection bump 28*a*.

As shown in FIG. 10, the interposer substrate structure IPA1 is lowered in the direction of the semiconductor chip mounting structure CH1. The support structure 45 and the upper connection bump 28*b* seat the interposer substrate structure IPA1 on the semiconductor chip mounting structure CH1 to correspond to the package upper protective layer 18 and the lower connection bump 28*a*, respectively.

As shown in FIG. 1, the support structure 45 may be stably seated on the package upper protective layer 18. The upper connection bump 28*b* having the flux coating layer 53 may be easily soldered to the lower connection bump 28*a* to form the connection bump structure 28. Because the flux coating layer 53 is uniformly formed on the surface of the upper connection bumps 28*b*, the reliability of the bonding between the upper connection bumps 28*b* and the lower connection bumps 28*a* may be greatly improved.

Figure 11:
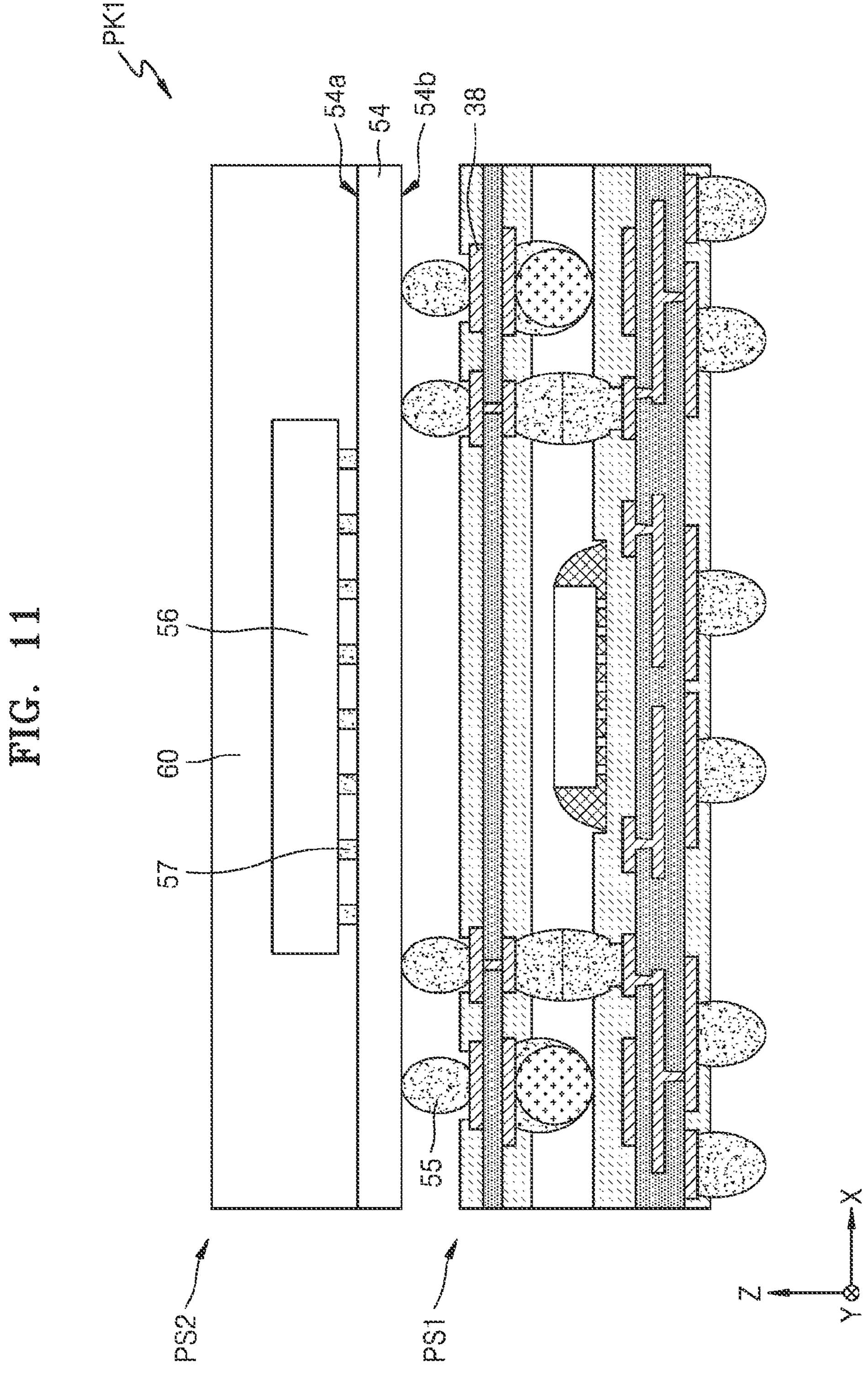
FIG. 11 is a cross-sectional view for explaining a stacked semiconductor package structure according to an exemplary embodiment of the inventive concept.

FIG. 11 is a cross-sectional view for describing a stacked semiconductor package structure according to an exemplary embodiment of the inventive concept.

In detail, a stacked semiconductor package structure PK1 includes a first semiconductor package structure PS1 and a second semiconductor package structure PS2. Because the first semiconductor package structure PS1 is described with reference to FIGS. 1 to 4, a description of the first semiconductor package structure PS1 is omitted herein as redundant.

The stacked semiconductor package structure PK1 is formed by stacking the second semiconductor package structure PS2 on the first semiconductor package structure PS1. The stacked semiconductor package structure PK1 may be a package on package (POP) type semiconductor package. The second semiconductor package structure PS2 may be electrically connected to the first semiconductor package structure PS1.

The second semiconductor package structure PS2 may include a second package substrate 54, a second external connection bump 55, a second semiconductor chip 56, a second chip connection bump 57, and a second molding layer 60. The second package substrate 54 may include an upper surface 54*a* and a lower surface 54*b*. The second package substrate 54 may have the same configuration as the package substrate 10. The second package substrate 54 may be a PCB.

A second external connection bump 55 may be provided on the lower surface of the second package substrate 54. The second external connection bump 55 may be electrically connected to the upper interposer connection pad 38 of the interposer substrate 30. The second external connection bump 55 may be a solder ball.

The second semiconductor chip 56 may be positioned on the second package substrate 54 and may be electrically connected to the second package substrate 54 using the second chip connection bump 57. The second semiconductor chip 56 may be flip-chip bonded to the second package substrate 54.

The second semiconductor chip 56 may be a logic chip or a memory chip. In some exemplary embodiments, when the first semiconductor chip 24 is a logic chip, the second semiconductor chip 56 may be a memory chip. In FIG. 11, the second semiconductor chip 56 is illustrated as one chip, but the second semiconductor chip 56 may be a stacked chip in which a plurality of second semiconductor chips are stacked.

The second molding layer 60 molds the second semiconductor chip 56 on the second package substrate 54. The second molding layer 60 seals both the second semiconductor chip 56 and the second chip connection bump 57, positioned on the second package substrate 54. The second molding layer 60 may be formed of the same material as the first molding layer 46 of FIGS. 1 to 4 described above.

Figure 12:
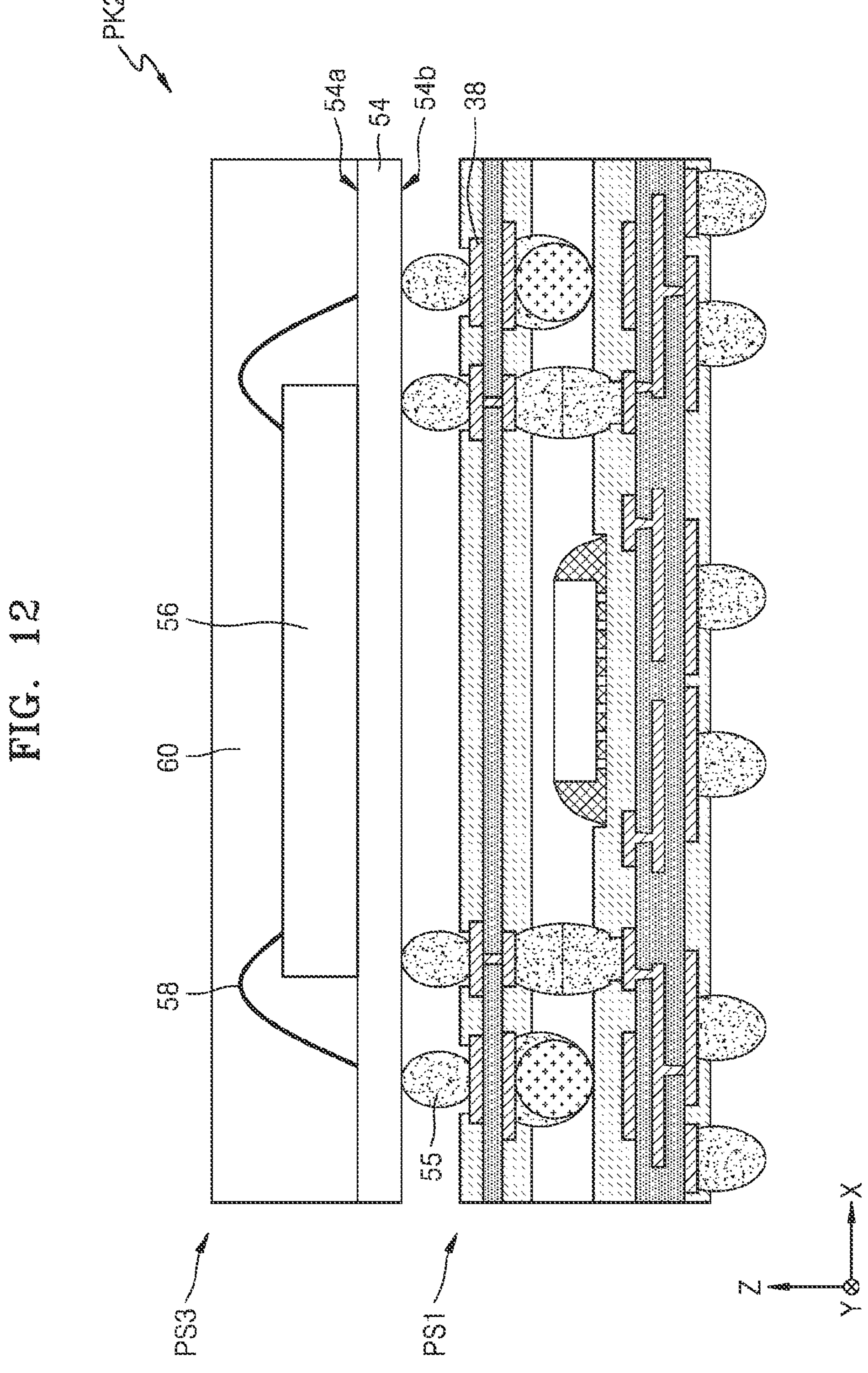
FIG. 12 is a cross-sectional view for explaining a stacked semiconductor package structure according to an exemplary embodiment of the inventive concept.

FIG. 12 is a cross-sectional view for explaining a stacked semiconductor package structure according to an exemplary embodiment of the inventive concept.

In detail, compared with the stacked semiconductor package structure PK1 of FIG. 11, the stacked semiconductor package structure PK2 may be the same, except that a second semiconductor chip 56 of a third semiconductor package structure PS3 is connected to a second package substrate 54 by a bonding wire 58. In FIG. 12, the same descriptions as those given in FIG. 11 are either briefly given or omitted as redundant.

The stacked semiconductor package structure PK2 includes a first semiconductor package structure PS1 and the third semiconductor package structure PS3. Because the first semiconductor package structure PS1 has been described with reference to FIGS. 1 to 4, a description of the first semiconductor package structure PS1 is omitted herein.

The stacked semiconductor package structure PK2 is formed by stacking the third semiconductor package structure PS3 on the first semiconductor package structure PS1. The third semiconductor package structure PS3 may be electrically connected to the first semiconductor package structure PS1.

The third semiconductor package structure PS3 may include the second package substrate 54, a second external connection bump 55, the second semiconductor chip 56, the bonding wire 58, and a second molding layer 60. The second semiconductor chip 56 may be positioned on the second package substrate 54 and may be electrically connected to the second package substrate 54 using the bonding wire 58.

Figure 13:
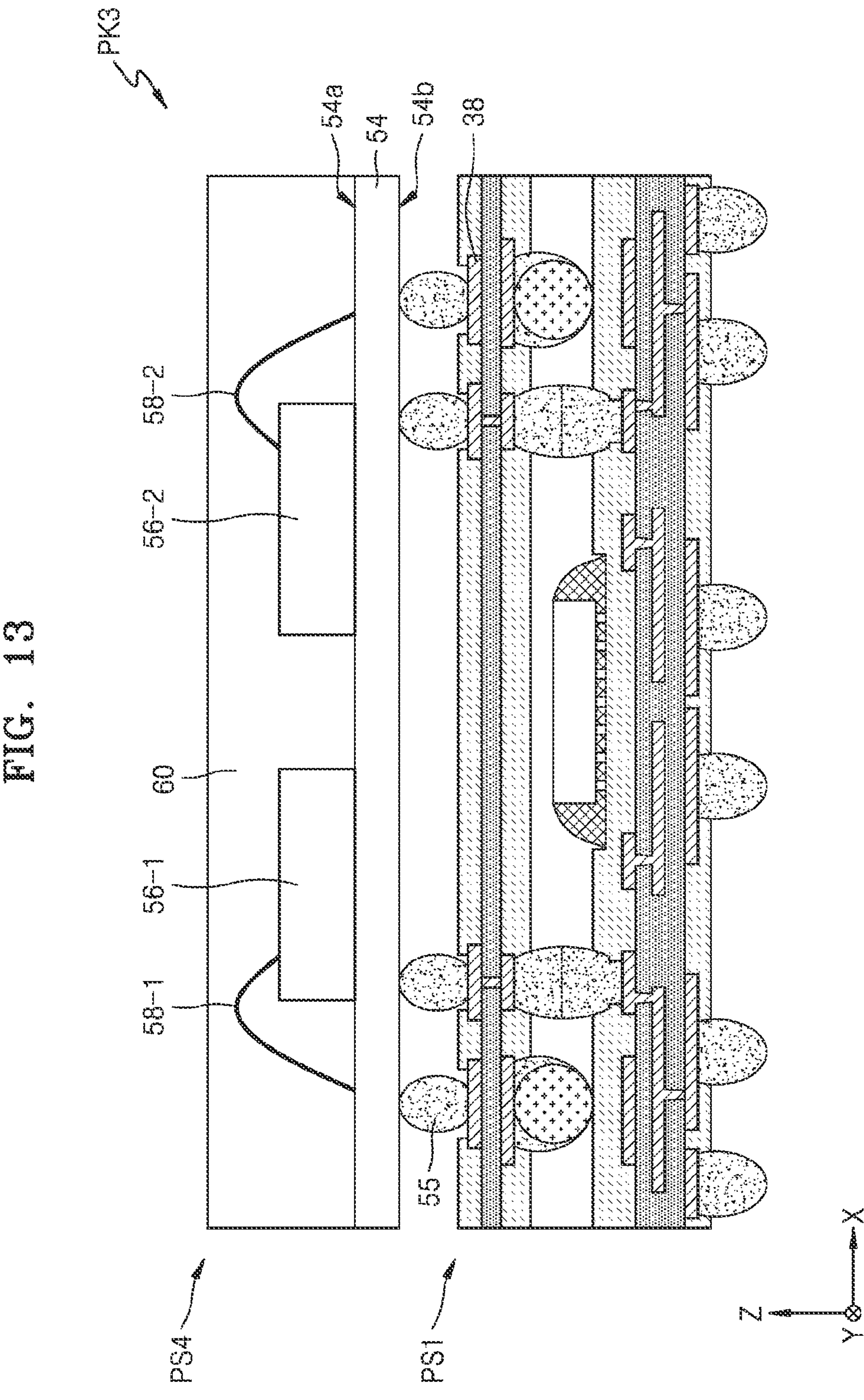
FIG. 13 is a cross-sectional view illustrating a stacked semiconductor package structure according to an exemplary embodiment of the inventive concept.

FIG. 13 is a cross-sectional view illustrating a stacked semiconductor package structure according to an embodiment of the inventive concept.

In detail, compared with the stacked semiconductor package structure PK2 of FIG. 12, the stacked semiconductor package structure PK3 may be the same except that a second semiconductor chip 56-1 and a third semiconductor chip 56-2 are included in a fourth semiconductor package structure PS4. In FIG. 13, the same descriptions as those given in FIG. 12 are either briefly given or omitted as redundant.

The stacked semiconductor package structure PK3 includes a first semiconductor package structure PS1 and the fourth semiconductor package structure PS4. Because the first semiconductor package structure PS1 has been described with reference to FIGS. 1 to 4, a description of the first semiconductor package structure PS1 is omitted herein.

The stacked semiconductor package structure PK3 is formed by stacking the fourth semiconductor package structure PS4 on the first semiconductor package structure PS1. The fourth semiconductor package structure PS4 may be electrically connected to the first semiconductor package structure PS1.

The fourth semiconductor package structure PS4 may include a second package substrate 54 and a second external connection bump 55, a second semiconductor chip 56-1, a third semiconductor chip 56-2, first and second bonding wires 58-1 and 58-2, and a second molding layer 60. The second package substrate 54 may include an upper surface 54*a* and a lower surface 54*b*. The second external connection bump 55 may be provided on a lower surface of the second package substrate 54.

The second external connection bump 55 may be electrically connected to an upper interposer connection pad 38 of the interposer substrate 30. The second external connection bump 55 may be a solder ball.

The second semiconductor chip 56-1 may be positioned on the second package substrate 54 and may be electrically connected to the second package substrate 54 using the first bonding wire 58-1. The third semiconductor chip 56-2 may be located on the second package substrate 54, spaced apart from the second semiconductor chip 56-1, and may be electrically connected to the second package substrate 54 using a second bonding wire 58-2. The second semiconductor chip 56-1 and the third semiconductor chip 56-2 may be flip-chip bonded to the second package substrate 54.

The second semiconductor chip 56-1 and the third semiconductor chip 56-2 may be a logic chip or a memory chip. In some exemplary embodiments, when the first semiconductor chip 24 is a logic chip, the second semiconductor chip 56-1 and the third semiconductor chip 56-2 may be memory chips. In FIG. 13, each of the second semiconductor chips 56-1 and the third semiconductor chip 56-2 are illustrated as a single chip, but may be a chip stack in which a plurality of chips are stacked.

The second molding layer 60 may mold the second semiconductor chip 56-1 and the third semiconductor chip 56-2 on the second package substrate 54. The second molding layer 60 seals all of the second semiconductor chips 56-1, the third semiconductor chip 56-2, the first bonding wire 58-1, and the second bonding wire 58-2, positioned on the second package substrate 54. The second molding layer 60 may be formed of the same material as the first molding layer 46 of FIGS. 1 to 4 described above.

Figure 14:
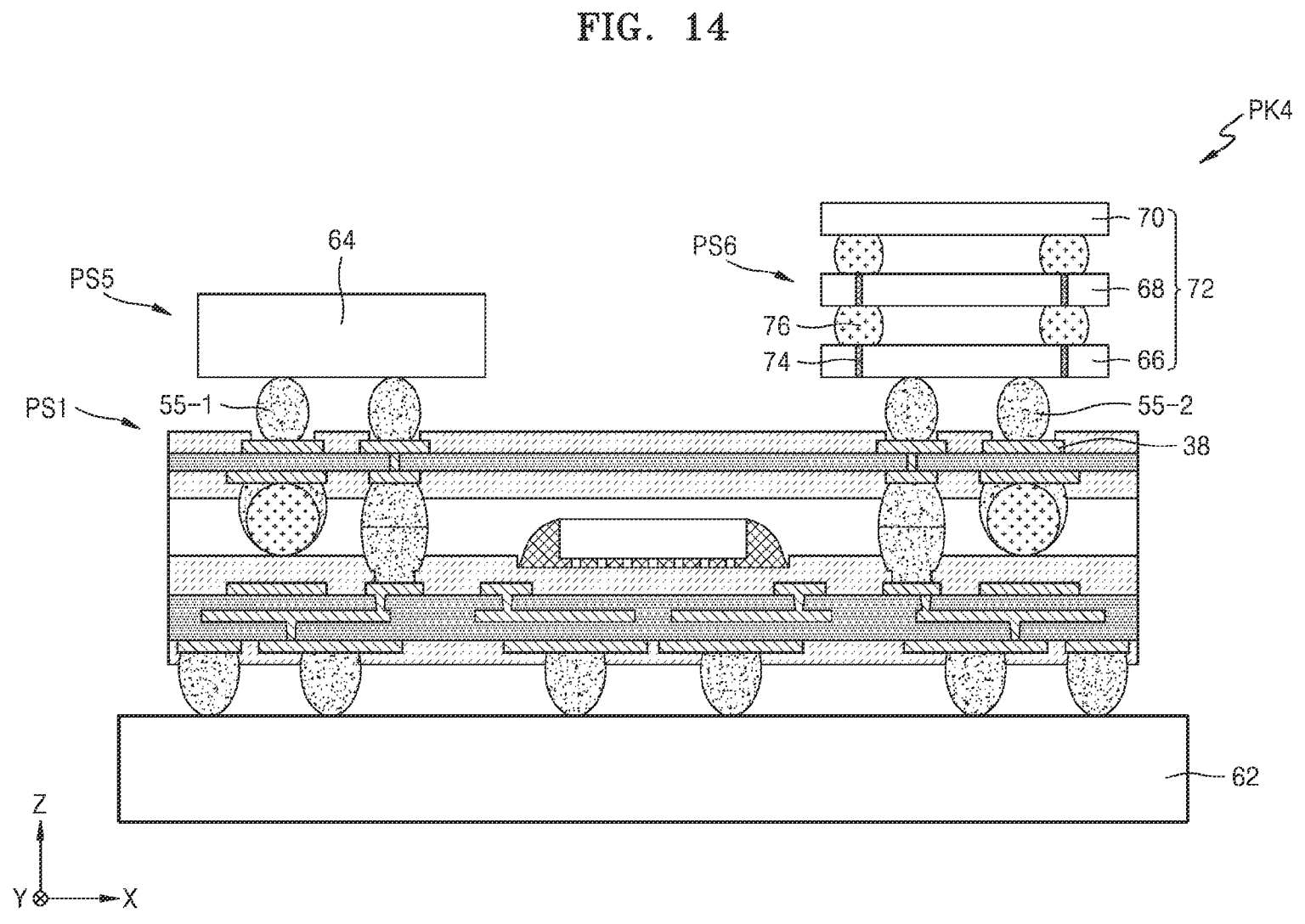

FIG. 14 is a cross-sectional view for explaining a stacked semiconductor package structure according to an exemplary embodiment of the inventive concept.

In detail, a stacked semiconductor package structure PK4 includes a main board substrate 62, a first semiconductor package structure PS1, a fifth semiconductor package structure PS5, and a sixth semiconductor package structure PS6.

The first semiconductor package structure PS1 may be mounted on the main board substrate 62. The main board substrate 62 may be a PCB. Because the first semiconductor package structure PS1 has been described with reference to FIGS. 1 to 4, a description of the first semiconductor package structure PS1 is omitted herein as redundant.

In the stacked semiconductor package structure PK4, the fifth semiconductor package structure PS5 and the sixth semiconductor package structure PS6 are stacked on the first semiconductor package structure PS1. The fifth semiconductor package structure PS5 and the sixth semiconductor package structure PS6 are formed to be spaced apart from each other in a horizontal direction, for example, an X direction.

The fifth semiconductor package structure PS5 includes a second semiconductor chip 64 and a second external connection bump 55-1. The second external connection bump 55-1 may be electrically connected to an upper interposer connection pad 38 of the interposer substrate 30. The second external connection bump 55-1 may be a solder ball. The second semiconductor chip 64 may be a logic chip.

The sixth semiconductor package structure PS6 includes a third semiconductor chip 72 and a third external connection bump 55-2. The third external connection bump 55-2 may be electrically connected to the upper interposer connection pad 38 of the interposer substrate 30. The third external connection bump 55-2 may be a solder ball.

The third semiconductor chip 72 may include a first sub-chip 66, a second sub-chip 68, and a third sub-chip 70. The first sub-chip 66, the second sub-chip 68, and the third sub-chip 70 may be electrically connected to each other through sub bumps 76 and sub through-vias 74. The sub through-via 74 may be a sub silicon through-via.

The first sub-chip 66, the second sub-chip 68, and the third sub-chip 70 may be memory chips. Although three sub-chips are illustrated in FIG. 14, more sub-chips may be stacked.

Figure 15:
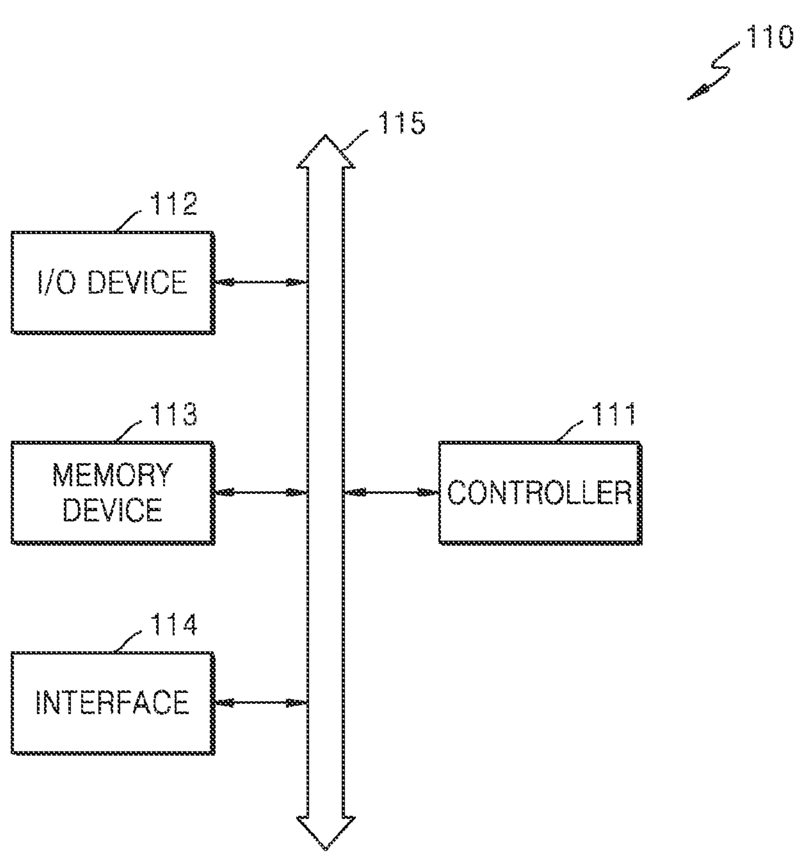
FIG. 15 is a schematic block diagram illustrating an example of a memory system including a semiconductor package structure according to an exemplary embodiment of the inventive concept.

FIG. 15 is a schematic block diagram illustrating an example of a memory system including a semiconductor package structure according to an exemplary embodiment of the inventive concept.

In detail, a memory system 110 may be applied to a personal digital assistant (PDA), a portable computer, a web tablet, a wireless phone, a mobile phone, a digital music player, a memory card, or any device capable of transmitting and/or receiving information in a wireless environment.

The memory system 110 includes a controller 111, an input/output (I/O) device 112 such as a keypad, a keyboard, and a display device, a memory device 113, an interface 114, and a bus 115. The memory device 113 and interface 114 communicate with each other via the bus 115.

The controller 111 may include at least one of a microprocessor, a digital signal processor, a microcontroller, and other processing devices similar thereto. The memory device 113 may be used to store instructions executed by the controller 111. The I/O device 112 may receive data or signals external of the system 110 or may output data or signals to the exterior of the system 110. For example, the I/O device 112 may include a keyboard, a keypad, or a display device.

The memory device 113 and the controller 111 may include a semiconductor package structure PS1 according to an exemplary embodiment of the inventive concept. The memory device 113 may further include other types of memories, volatile memories that may be accessed at any time, and other various types of memories. The interface 114 transmits data to or receives data from a communication network.

Figure 16:
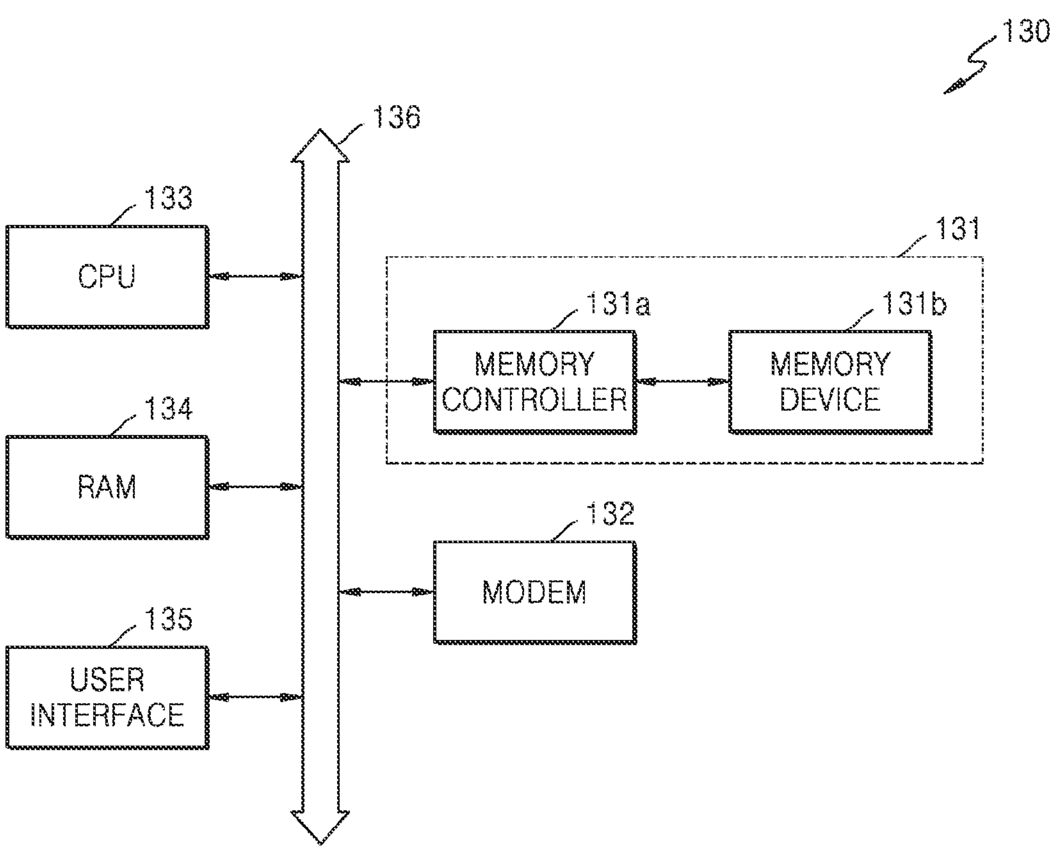
FIG. 16 is a schematic block diagram illustrating an example of an information processing system including a semiconductor package structure according to an exemplary embodiment of the inventive concept.

FIG. 16 is a schematic block diagram illustrating an example of an information processing system including a semiconductor package structure according to an exemplary embodiment of the inventive concept.

In detail, an information processing system 130 may be used in a mobile device or a desktop computer. The information processing system 130 may include a memory system 131 including a memory device 131*a* and a memory controller 131*b*.

The information processing system 130 includes a MODEM 132, a CPU 133, RAM 134, and a user interface 135, electrically connected to a system bus 136. Data processed by the CPU 133 or data input from the exterior is stored in the memory system 131.

The memory system 131 including the memory device 131*a* and the memory controller 131*b*, the MODEM 132, the CPU 133, and the RAM 134 include a semiconductor package structure PS1 according to the exemplary embodiment of the inventive concept.

The memory system 131 may be configured as a solid state drive, and in this case, the information processing system 130 may stably store a large amount of data in the memory system 131. In addition, as reliability increases, the memory system 131 may reduce resources required for error correction, thereby providing a high-speed data exchange functionality to the information processing system 130. Although not shown, it would be apparent to those having skill in the art that the information processing system 130 may further include an application chipset, a camera image signal processor (ISP), an input/output device, and the like.

While the inventive concept has been particularly shown and described with reference to exemplary embodiments thereof, it will be understood that various changes and modifications in details may be made therein without departing from the spirit and scope of the following claims.

What is claimed is:

1. A semiconductor package structure comprising:

a package substrate;

a semiconductor chip positioned on the package substrate;

a lower connection bump formed on the package substrate;

an interposer substrate located on the lower connection bump on the package substrate and an upper surface of the semiconductor chip;

an upper connection bump located on a lower surface of the interposer substrate and electrically connected to the lower connection bump on the package substrate; and a first support structure located on the lower surface of the interposer substrate, spaced apart from the upper connection bump to provide support between the package substrate and the interposer substrate, wherein the upper connection bump and the lower connection bump constitute a first connection bump structure, wherein the first support structure includes a metal core ball and a ball cover layer surrounding the metal core ball, the ball cover layer is formed to gradually decrease in thickness in a direction from the interposer substrate to the package substrate in a cross-sectional view, wherein the metal core ball is formed to have a circular or elliptical shape in the cross-sectional view, and wherein the package substrate includes a package upper protective layer, and a lowest surface point of the metal core ball is in contact with an upper surface of the package upper protective layer in the cross-sectional view.

2. The semiconductor package structure of claim 1, wherein the package substrate includes a package wiring layer, and the first support structure is a dummy structure that is not electrically connected to the package wiring layer.

3. The semiconductor package structure of claim 1, wherein the package substrate includes a package wiring layer, and the first connection bump structure is electrically connected to the package wiring layer.

4. The semiconductor package structure of claim 1, wherein the ball cover layer is formed to surround a portion of the metal core ball to expose a lower surface of the metal core ball.

5. The semiconductor package structure of claim 1, wherein the ball cover layer is formed to a predetermined thickness on a lower surface of the metal core ball.

6. The semiconductor package structure of claim 1, wherein the package substrate includes a package upper connection pad, the interposer substrate includes a lower interposer connection pad, and the first connection bump structure electrically connects the lower interposer connection pad to the package upper connection pad.

7. The semiconductor package structure of claim 1, wherein the semiconductor package structure comprises a plurality of connection bump structures and a plurality of support structures, the plurality of connection bump structures comprise the first connection bump structure, and the plurality of support structures comprise the first support structure, the plurality of connection bump structures, in a plan view, are arranged on an outer periphery of the semiconductor chip, and the plurality of support structures, in the plan view, are arranged on an outer periphery of the plurality of connection bump structures.

8. A semiconductor package structure comprising:

a semiconductor chip mounting structure including a package substrate, a semiconductor chip mounted on the package substrate, and a lower connection bump formed on the package substrate around the semiconductor chip;

an interposer substrate structure positioned on the semiconductor chip mounting structure, wherein the interposer substrate structure includes an interposer substrate, an upper connection bump located on a lower surface of the interposer substrate and electrically connected to the lower connection bump on the package substrate, and a support structure located on the lower surface of the interposer substrate, spaced apart from the upper connection bump to provide support between the package substrate and the interposer substrate, wherein the upper connection bump and the lower connection bump constitute a connection bump structure, the support structure includes a metal core ball and a ball cover layer surrounding the metal core ball, the ball cover layer is formed to be gradually thinner in a cross-sectional view in a direction from the interposer substrate to the package substrate, and the metal core ball is circular or elliptical in the cross-sectional view;

wherein the package substrate includes a package upper protective layer, and a lowest surface point of the metal core ball is in contact with an upper surface of the package upper protective layer; and wherein a molding layer that provides a seal between an upper portion of the semiconductor chip mounting structure and a lower portion of the interposer substrate structure.

9. The semiconductor package structure of claim 8, wherein the package substrate includes a package wiring layer and a package upper connection pad electrically connected to the package wiring layer, and the support structure is a dummy structure that is not electrically connected to the package upper connection pad.

10. The semiconductor package structure of claim 8, wherein the package substrate includes a package wiring layer and a package upper connection pad electrically connected to the package wiring layer, the interposer substrate includes an interposer wiring layer and a lower interposer connection pad electrically connected to the interposer wiring layer, and the connection bump structure electrically connects the lower interposer connection pad to the package upper connection pad.

11. The semiconductor package structure of claim 8, wherein a lower surface of the ball cover layer surrounding the metal core ball is in contact with the package upper protective layer.

12. The semiconductor package structure of claim 8, wherein the interposer substrate includes a lower interposer connection pad, and an upper surface of the metal core ball and an upper surface of the ball cover layer are in contact with a lower surface of the lower interposer connection pad.

13. The semiconductor package structure of claim 8, wherein the interposer substrate includes a first lower interposer connection pad connected to the support structure; and a second lower interposer connection pad connected to the connection bump structure, wherein a size of the second lower interposer connection pad is less than a size of the first lower interposer connection pad.

14. A stacked semiconductor package structure comprising:

a first semiconductor package structure; and a second semiconductor package structure stacked on the first semiconductor package structure, wherein the first semiconductor package structure comprises a first package substrate;

a first semiconductor chip located on the first package substrate;

a lower connection bump formed on the first package substrate;

an interposer substrate positioned on the lower connection bump on the first package substrate and an upper portion of the first semiconductor chip;

an upper connection bump located on a lower surface of the interposer substrate and electrically connected to the lower connection bump on the first package substrate; and a support structure located on the lower surface of the interposer substrate, spaced apart from the upper connection bump to provide support between the first package substrate and the interposer substrate, wherein the upper connection bump and the lower connection bump constitute a connection bump structure, wherein the support structure includes a metal core ball and a ball cover layer surrounding the metal core ball, the ball cover layer is formed in a cross-sectional view to gradually decrease in thickness in a direction from the interposer substrate to the first package substrate, and the metal core ball is circular or elliptical in the cross-sectional view, and wherein the first package substrate includes a package upper protective layer, and a lowest surface point of the metal core ball is in contact with an upper surface of the package upper protective layer, and wherein the second semiconductor package structure comprises a second package substrate;

an external connection bump formed on a lower surface of the second package substrate and electrically connected to the interposer substrate; and a second semiconductor chip located on an upper surface of the second package substrate.

15. The stacked semiconductor package structure of claim 14, wherein the first package substrate includes a package wiring layer, the interposer substrate includes an interposer wiring layer, the support structure is a dummy structure that is not electrically connected to the package wiring layer and the interposer wiring layer, and the connection bump structure is electrically connected to the package wiring layer and the interposer wiring layer.

16. The stacked semiconductor package structure of claim 14, further comprising a first molding layer sealing the entirety of the first semiconductor chip, the upper connection bump and the lower connection bump, and the support structure, between an upper surface of the first package substrate and the lower surface of the interposer substrate, and a second molding layer sealing the second semiconductor chip on the second package substrate.

* * * * *